US010515970B2

United States Patent
Hsu et al.

(10) Patent No.: US 10,515,970 B2
(45) Date of Patent: Dec. 24, 2019

(54) STATIC RANDOM ACCESS MEMORY AND MANUFACTURING METHOD THEREOF

(71) Applicant: TAIWAN SEMICONDUCTOR MANUFACTURING CO., LTD., Hsinchu (TW)

(72) Inventors: Kuo-Hsiu Hsu, Zhongli (TW); Chong-De Lien, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/042,304

(22) Filed: Jul. 23, 2018

(65) Prior Publication Data
US 2018/0350820 A1    Dec. 6, 2018

Related U.S. Application Data

(62) Division of application No. 15/059,021, filed on Mar. 2, 2016, now Pat. No. 10,032,782.

(51) Int. Cl.
*H01L 27/11* (2006.01)
*H01L 29/06* (2006.01)
(Continued)

(52) U.S. Cl.
CPC ...... *H01L 27/1104* (2013.01); *H01L 27/0207* (2013.01); *H01L 27/1052* (2013.01);
(Continued)

(58) Field of Classification Search
CPC .......... H01L 27/1104; H01L 27/1052; H01L 27/0207; H01L 29/4238; H01L 29/785; H01L 29/66795; G11C 11/412
(Continued)

(56) References Cited

U.S. PATENT DOCUMENTS 7,737,501 B2    6/2010    Zhu et al.
8,004,042 B2    8/2011    Yang et al.
(Continued)

OTHER PUBLICATIONS

Non-Final Office Aciton issued in related parent U.S. Appl. No. 15/059,021, dated Jan. 12, 2017.
(Continued)

*Primary Examiner* — Thinh T Nguyen
(74) *Attorney, Agent, or Firm* — McDermott Will & Emery LLP

(57) ABSTRACT

A static random access memory (SRAM) cell includes first through fourth transistors being first type transistors and fifth and sixth transistors being second type transistors. Source regions of the first and second transistors are formed by a first source diffusion region, source regions of the fifth and sixth transistors are formed by second and third source diffusion regions, respectively, and source regions of the third and fourth transistors are formed by a fourth source diffusion region. The SRAM cell further includes a first data storage electrode linearly extending from a first gate line of the third and sixth transistors and electrically connecting the first gate line and the first and second source diffusion regions, and a second data storage electrode linearly extending from a second gate line of the second and fifth transistors and electrically connecting the second gate line and the third and fourth source diffusion regions.

20 Claims, 13 Drawing Sheets

(51) Int. Cl.
*H01L 27/02* (2006.01)
*H01L 27/105* (2006.01)
*H01L 29/66* (2006.01)
*H01L 29/78* (2006.01)
*H01L 29/423* (2006.01)

(52) U.S. Cl.
CPC ...... *H01L 29/0696* (2013.01); *H01L 29/4238* (2013.01); *H01L 29/66795* (2013.01); *H01L 29/785* (2013.01)

(58) Field of Classification Search
USPC ........ 438/107, 197, 199, 294, 675; 257/401, 257/366, 369, 393
See application file for complete search history.

(56) References Cited

U.S. PATENT DOCUMENTS

| | | |
|---|---|---|
| 8,247,846 B2 | 8/2012 | Becker |
| 8,947,912 B2 | 2/2015 | Calhoun et al. |
| 9,036,404 B2 | 5/2015 | Liaw |
| 2005/0029556 A1* | 8/2005 | Wang et al. ............ H01L 27/11 257/250 |
| 2007/0235765 A1 | 10/2007 | Liaw |
| 2009/0014798 A1 | 1/2009 | Zhu et al. |
| 2009/0224317 A1 | 9/2009 | Becker |
| 2010/0237419 A1 | 9/2010 | Yang et al. |
| 2011/0075470 A1 | 3/2011 | Liaw |
| 2013/0242645 A1 | 9/2013 | Calhoun et al. |
| 2013/0258759 A1 | 10/2013 | Liaw |
| 2014/0191321 A1 | 7/2014 | Cheng et al. |
| 2015/0370948 A1 | 12/2015 | Kawa et al. |
| 2016/0078922 A1 | 3/2016 | Liaw |

OTHER PUBLICATIONS

Non-Final Office Aciton issued in related parent U.S. Appl. No. 15/059,021, dated Oct. 30, 2017.

Final Office Aciton issued in related parent U.S. Appl. No. 15/059,021, dated Jun. 29, 2017.

Notice of Allowance issued in related parent U.S. Appl. No. 15/059,021, dated Mar. 26, 2018.

* cited by examiner

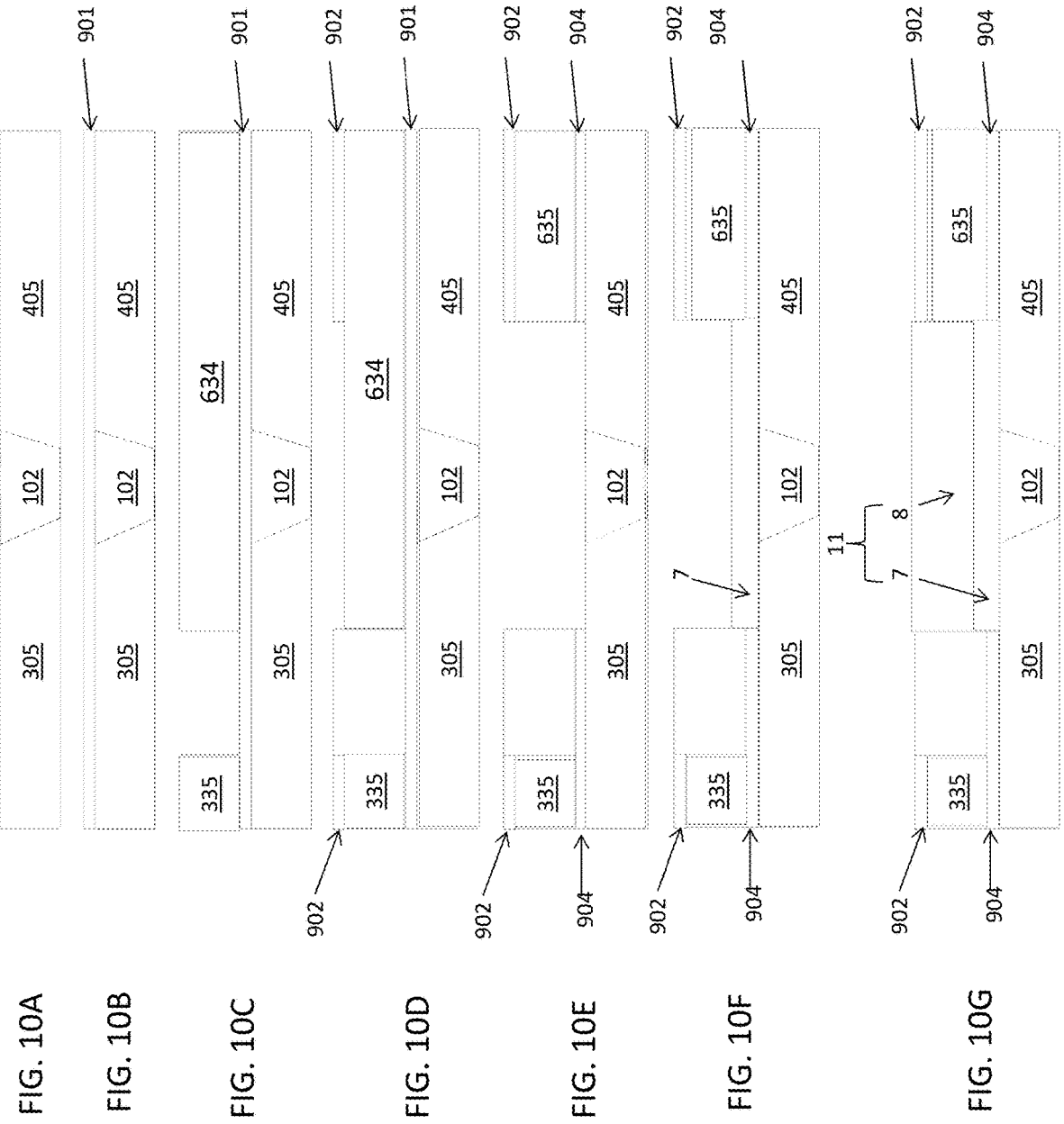

STATIC RANDOM ACCESS MEMORY AND MANUFACTURING METHOD THEREOF

CROSS-CITATION TO RELATED APPLICATION

This application is a Divisional Application of U.S. Ser. No. 15/059,021 filed Mar. 2, 2016, the subject matter of which is incorporated by reference in entirety.

TECHNICAL FIELD

The present disclosure is generally related to a static random access memory (SRAM) and a method of manufacturing for the same, and more particularly, to interconnections in an SRAM and a method of manufacturing the same.

BACKGROUND

A static random access memory (SRAM) is commonly used for data storage when the SRAM is supplied with power. To meet the demand in portable electronics and high speed computation, it is desirable to integrate more data storage cells including cross-coupled invertors into a single SRAM chip and to lower power consumption thereof, for example, by replacing conventional transistors with vertical transistors having smaller size and lower power consumption. However, challenges have emerged from integrating vertical transistors into a SRAM chip in the semiconductor industry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A through 10G are cross-sectional views schematically illustrate a method for manufacturing a data storage electrode according to other embodiments of the present disclosure.

DETAILED DESCRIPTION

Figure 1B:
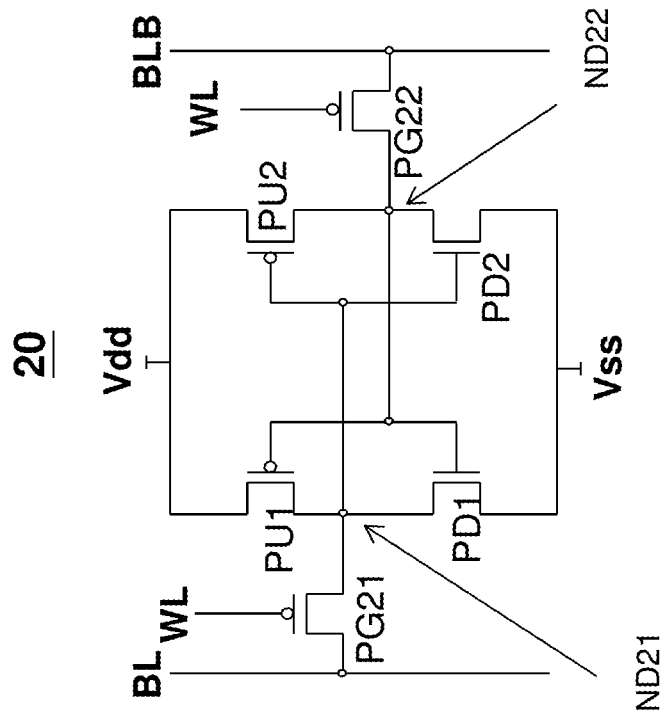
FIGS. 1A and 1B are exemplary circuit diagrams of SRAM cells according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Although in the present disclosure, circuit diagrams, layouts, and manufacturing methods of a single static random access memory (SRAM) cell are explained, it should be appreciated that an SRAM generally includes a plurality of SRAM cells arranged in an array. In such an SRAM, wordlines of the SRAM cells in the same row of the array may be connected to each other, bitlines of the SRAM cells in the same column of the array may be connected to each other, and power supply nodes of the SRAM cells in the same row or the same column may be connected to each other.

It should be appreciated that specifying source and drain regions, and source and drain electrodes of the same transistor in the present disclosure is merely to distinguish the source and drain regions from each other and to distinguish the source and drain electrodes from each other. The source and drain regions of the same transistor can be alternatively referred to as drain and source regions, respectively, and the source and drain electrodes of the same transistor can be alternatively referred to as drain and source electrodes, respectively.

In the present disclosure, when source (drain) regions of two or more transistors are formed by the same layer and are connected to each other, the same layer is referred to as a source (drain) diffusion region. When gate electrodes of two or more transistors are formed by the same layer and are connected to each other, the same gate layer is referred to as a gate line.

In the present disclosure, a source diffusion region, of which a source region of a transistor is formed, refers to a diffusion region heavily doped with impurities formed in a top portion of a well in a substrate, and is surrounded by an insulating layer such as a shallow trench isolation (STI). The STI has a trench depth deeper than the source diffusion region but shallower than the well in which the source diffusion region is formed. Adjacent source diffusion regions are separated by the STI interposed therebetween.

Figure 1A:
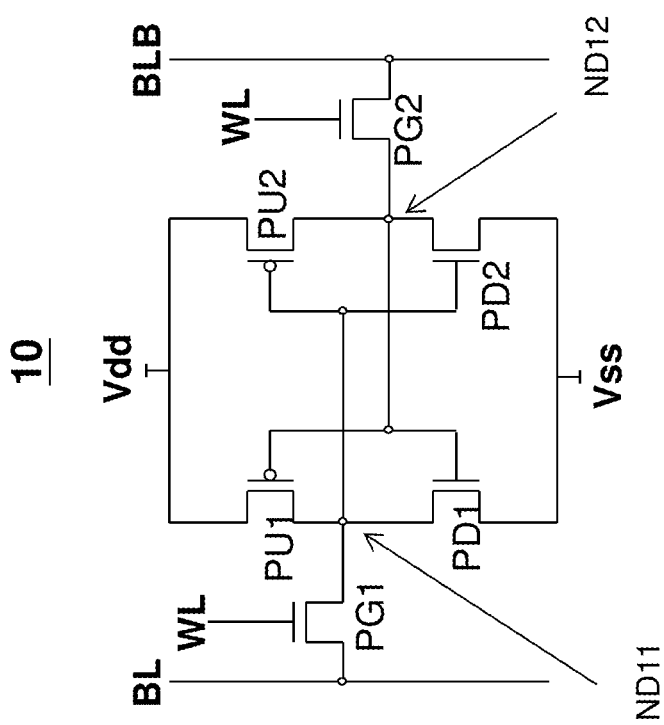

FIGS. 1A and 1B are exemplary circuit diagrams of SRAM cells according to various embodiments of the present disclosure.

Referring to FIG. 1A, an SRAM cell 10 includes a first pull-up transistor PU1, a first pull-down transistor PD1, and a first pass-gate transistor PG1. Source electrodes of the first pull-up transistor PU1, the first pull-down transistor PD1, and the first pass-gate transistor PG1 are electrically connected at a first data storage node ND11. The SRAM cell 10 further includes a second pull-up transistor PU2, a second pull-down transistor PD2, and a second pass-gate transistor PG2. Source electrodes of the second pull-up transistor PU2, the second pull-down transistor PD2, and the second pass-gate transistor PG2 are electrically connected at a second data storage node ND12.

In some embodiments, gate electrodes of the second pull-up transistor PU2 and the second pull-down transistor PD2 are electrically connected to the source electrodes of the first pull-down transistor PD1, the first pass-gate transistor PG1, and the first pull-up transistor PU1 through the first data storage node ND11. Gate electrodes of the first pull-up transistor PU1 and the first pull-down transistor PD1 are electrically connected to the source electrodes of the second pull-down transistor PD2, the second pass-gate transistor PG2, and the second pull-up transistor PU2 through the second data storage node ND12.

Drain electrodes of the first and second pull-up transistors PU1 and PU2 are connected to a first power supply node Vdd, while drain electrodes of the first and second pull-down transistors PD1 and PD2 are connected to a second power supply node Vss. According to some embodiments, the first power supply node Vdd may be electrically connected to a positive electrical potential, supplied from a power supply circuit (not shown) of the SRAM, and the second power supply node Vss may be electrically connected to a ground.

Gate electrodes of the first and second pass-gate transistors PG1 and PG2 are connected to a wordline WL. Drain electrodes of the first and second pass-gate transistors PG1 and PG2 are connected to first and second bitlines BL and BLB, respectively.

According to some embodiments, in the SRAM cell 10, the first and second pass-gate transistors PG1 and PG2 and the first and second pull-down transistors PD1 and PD2 are N-type transistors, and the first and second pull-up transistors PU1 and PU2 are P-type transistors.

During a reading operation of the SRAM cell 10, when the first and second pass-gate transistors PG1 and PG2 are turned on, for example, by a reading signal applied to the gate electrodes of the first and second pass-gate transistors PG1 and PG2 via the wordline WL, complementary data stored in the first and second data storage nodes ND11 and ND12 are transmitted, via the first and second pass-gate transistors PG1 and PG2, to the first and second bitlines BL and BLB which are connected to a sense amplifier (not shown) of the SRAM, respectively. During a writing operation of the SRAM cell 10, when the first and second pass-gate transistors PG1 and PG2 are turned on, for example, by a writing signal applied to the gate electrodes of the first and second pass-gate transistors PG1 and PG2 via the wordline WL, complementary data pre-applied to the first and second data lines BL and BLB are transmitted to the first and second data storage nodes ND11 and ND12 via the first and second pass-gate transistors PG1 and PG2 and stored at the first and second data storage nodes ND11 and ND12, respectively.

Referring to FIG. 1B, an SRAM cell 20 according to other embodiments includes P-type first and second pass-gate transistors PG21 and PG22 and P-type first and second pull-up transistor PU1 and PU2, and N-type first and second pull-down transistors PD1 and PD2. A description of features overlapping those of the SRAM cell 10 described above will be omitted in order to avoid redundancy.

Referring to FIG. 1B, reference character ND21 denotes a first data storage node disposed between source electrodes of the first pull-up transistor PU1, the first pull-down transistor PD1, and the first pass-gate transistor PG21 and gate electrodes of the second pull-up transistor PU2 and the second pull-down transistor PD2. In some embodiments, the gate electrodes of the second pull-up transistor PU2 and the second pull-down transistor PD2 are electrically connected to the source electrodes of the first pull-down transistor PG1, the first pass-gate transistor PG21, and the first pull-up transistor PU1 through the first data storage node ND21.

Reference character ND22 denotes a second data storage node disposed between source electrodes of the second pull-up transistor PU2, the second pull-down transistor PD2, and the second pass-gate transistor PG22 and gate electrodes of the first pull-up transistor PU1 and the first pull-down transistor PD1. In some embodiments, the gate electrodes of the first pull-up transistor PU1 and the first pull-down transistor PD1 are electrically connected to the source electrodes of the second pull-down transistor PG2, the second pass-gate transistor PG22, and the second pull-up transistor PU2 through the second data storage node ND22.

Figure 2:
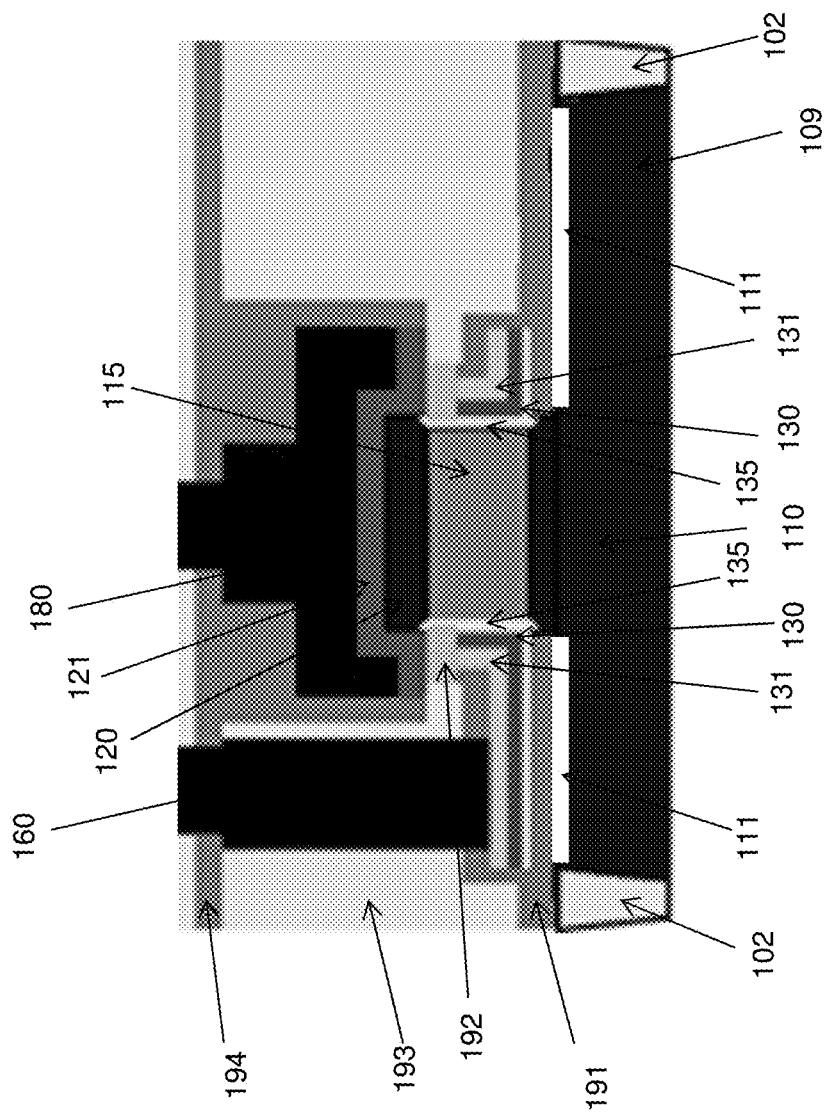
FIG. 2 is a schematically cross-sectional view of an exemplary vertical transistor according to some embodiments of the present disclosure.

FIG. 2 is a schematically cross-sectional view of an exemplary vertical transistor according to various embodiments of the present disclosure. The exemplary vertical transistor, configured as either an N-type transistor or a P-type transistor, may be employed in the first and second SRAM cells 10 and 20 illustrated in FIG. 1.

Referring to FIG. 2, an exemplary vertical transistor 50 includes source and drain regions 110 and 120 and a channel 115 interposed therebetween. The source region 110, the channel 115, and the drain region 120 may be vertically formed on a substrate (not shown) by stacking the source region 110, the channel 115, and the drain region 120 on one another in a direction perpendicular to a major surface of the substrate. The source region 110 is formed by a source diffusion region 109. In some embodiments, a silicide layer 111 is formed on and conterminous to the source diffusion region 109, except that a portion of the silicide layer 111 is removed so as to form the vertical transistor 50. A combination of the source diffusion region 109 and the silicide layer 111 formed thereon is referred to a bottom plate of the vertical transistor 50. According to other embodiments, a germanide layer, instead of silicide layer, is alternatively formed on a source diffusion region to implement a bottom plate including the source diffusion region and the germanide layer. The exemplary vertical transistor 50 further includes a gate electrode 130 surrounding the channel 115 and a gate insulating layer 135 interposed between the gate electrode 130 and the channel 115 so as to electrically isolate the channel 115 from the gate electrode 130. Since the gate electrode 130 surrounds the channel 115, the exemplary vertical transistor 50 may be called as a vertical gate all-around (VGAA) transistor. According to various embodiments of the present disclosure, the exemplary vertical transistor 50 may be either an N-type transistor or a P-type transistor. However, for convenience of explanation, the exemplary vertical transistor 50 is configured to be an N-type transistor as an example in the following description.

The exemplary vertical transistor 50 may be formed in an N+ ("+" refers to being heavily doped) source diffusion region 109 with heavily doped N-type impurities, such as P, As, Sb, N, or combinations thereof. The source diffusion region 109 may be first defined by shallow trench isolation (STI) 102. By forming the STI 102, electric current leakage between the exemplary vertical transistor 50 and other semiconductor devices formed in source diffusion regions adjacent to the source diffusion region 109 can be minimized or prevented. According to other embodiments, the N+ source diffusion region 109 is formed of an epitaxy layer epitaxially grown on the substrate.

A portion of the N+ source diffusion region 109, on which the exemplary vertical transistor 50 is formed, acts as a source region of the exemplary vertical transistor 50. Although not illustrated in FIG. 2, according to other embodiments of the present disclosure, additional vertical transistors having the same conductivity type as the exemplary vertical transistor 50 is formed in the same N+ source diffusion region 109, and thus, source regions of all the vertical transistors formed by the same N+ source diffusion region 109 are electrically connected to each other. Such features will become more apparent with reference to FIG. 3 to be described later.

According to some embodiments, the channel 115 of the exemplary vertical transistor 50 may be a single nanowire, multiple nanowires, or a nano-bar type having a rectangular shape viewed in a direction perpendicular to the major surface of the substrate 100. The channel 115 may include a semiconductor material, which may be formed by epitaxy, such as silicon, germanium, SiGe, SiC, SP, SiPC, a III-V compound semiconductor, or the like. For example, the III-V compound semiconductor may include InP, InAs, GaAs, AlInAs, InGaP, InGaAs, GaAsSb, GaPN, AlPN, or combinations thereof. The channel 115 may include, if necessary, lightly doped P-type impurities so as to form a P-type semiconductor. The gate electrode 130, which may be formed of polysilicon or another conductive material such as a metal, a metal alloy, a metal silicide, etc., surrounds the channel 115. The gate insulating layer 135, interposed between the gate electrode 130 and the channel 115 so as to electrically isolate the channel 115 from the gate electrode 130, may include one or more high-k dielectric layers, such as metal oxides. Examples of metal oxides include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof.

The drain region 120 of the exemplary vertical transistor 50 is formed of an N+ semiconductor layer including heavily doped N-type impurities, such as P, As, Sb, Ge, N, C, or combinations thereof. The exemplary transistor 50 further includes a conductive layer 121 formed of polysilicon, silicide, a metal, a metal alloy, or the like over the drain region 120. The drain region 120 and the conductive layer 121 are in combination referred to as a top plate of the exemplary transistor 50. If necessary, a contact via 180 may be formed over the top plate to electrically connect to each other the drain region 120 through the conductive layer 121 and a metal layer (not shown in FIG. 2) formed over the exemplary transistor 50.

The exemplary transistor 50 further includes a local connection layer 131 over the gate electrode 130. In some embodiments, the gate electrode 130 of the exemplary vertical transistor 50 may be connected to drain regions of other vertical transistors through the local connection layer 131. The local connection layer 131 may be formed of polysilicon or another conductive material such as a metal, a metal alloy, a metal silicide, or the like. In other embodiments, the gate electrode 130 may be connected to a metal layer, such as a wordline, formed over the exemplary transistor 50 through a contact via 160 and/or the local connection layer 131.

As shown in FIG. 2, the exemplary vertical transistor 50 may include one or more dielectric layers, such as dielectric layers 191 through 194. Such dielectric layers may insolate various conductive or semiconductor layers from each other and may include a plurality of through holes, in which the contact vias 160 and 180 are formed. It should be appreciated that the dielectric layers 191 through 194 are merely for the purpose of illustration and the exemplary vertical transistor 50 according to embodiments of the present disclosure may have fewer or more than four dielectric layers.

It should be appreciated that one skilled in the art will recognize that a P-type vertical transistor may be manufactured, for example, by using different types of dopants mentioned above to form the N-type exemplary vertical transistor 50. Such features will become more apparent with reference to FIGS. 3 through 7B and 13.

Figure 3:
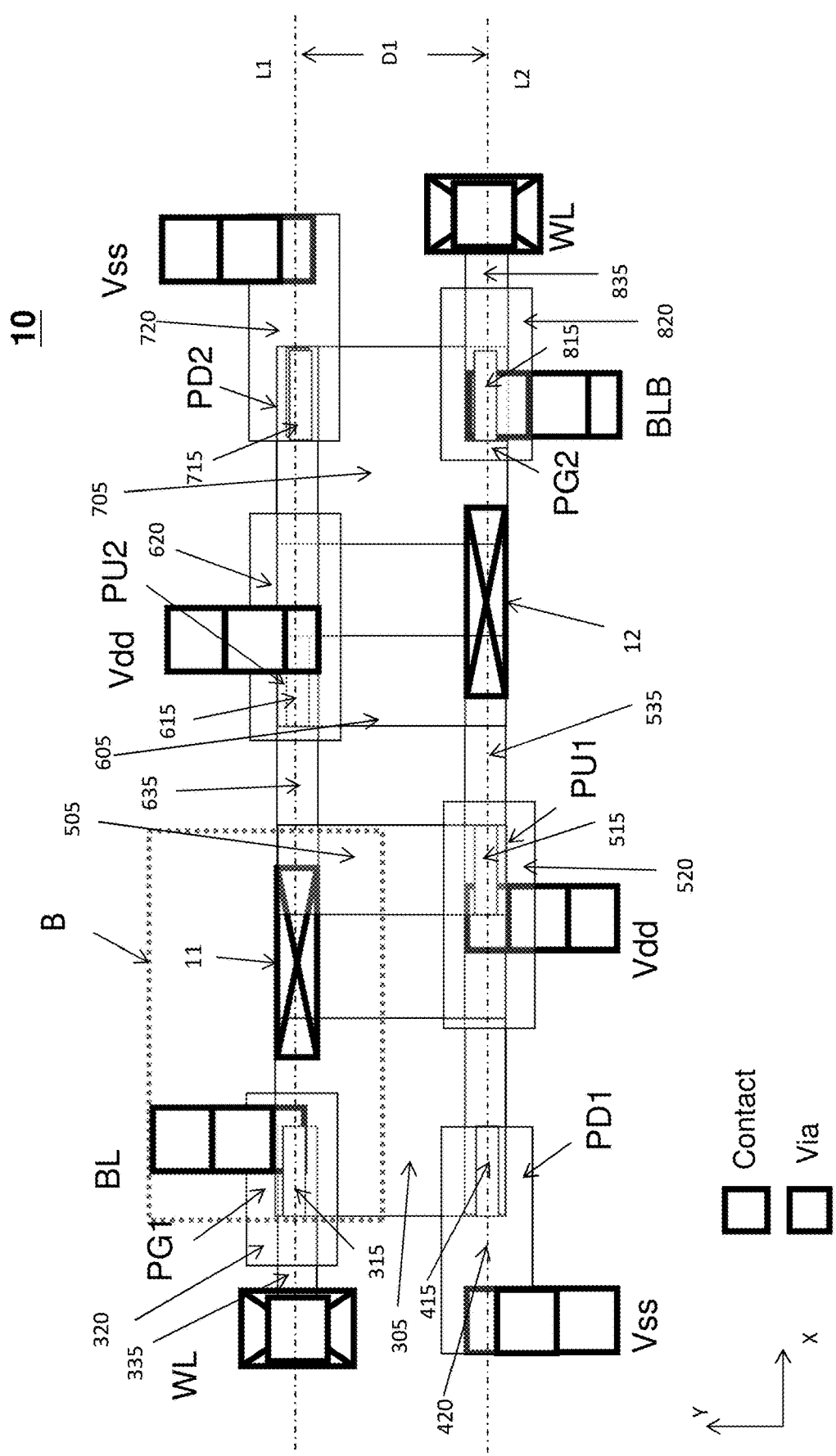
FIG. 3 is a layout of an SRAM cell according to some embodiments of the present disclosure.
Figure 4:
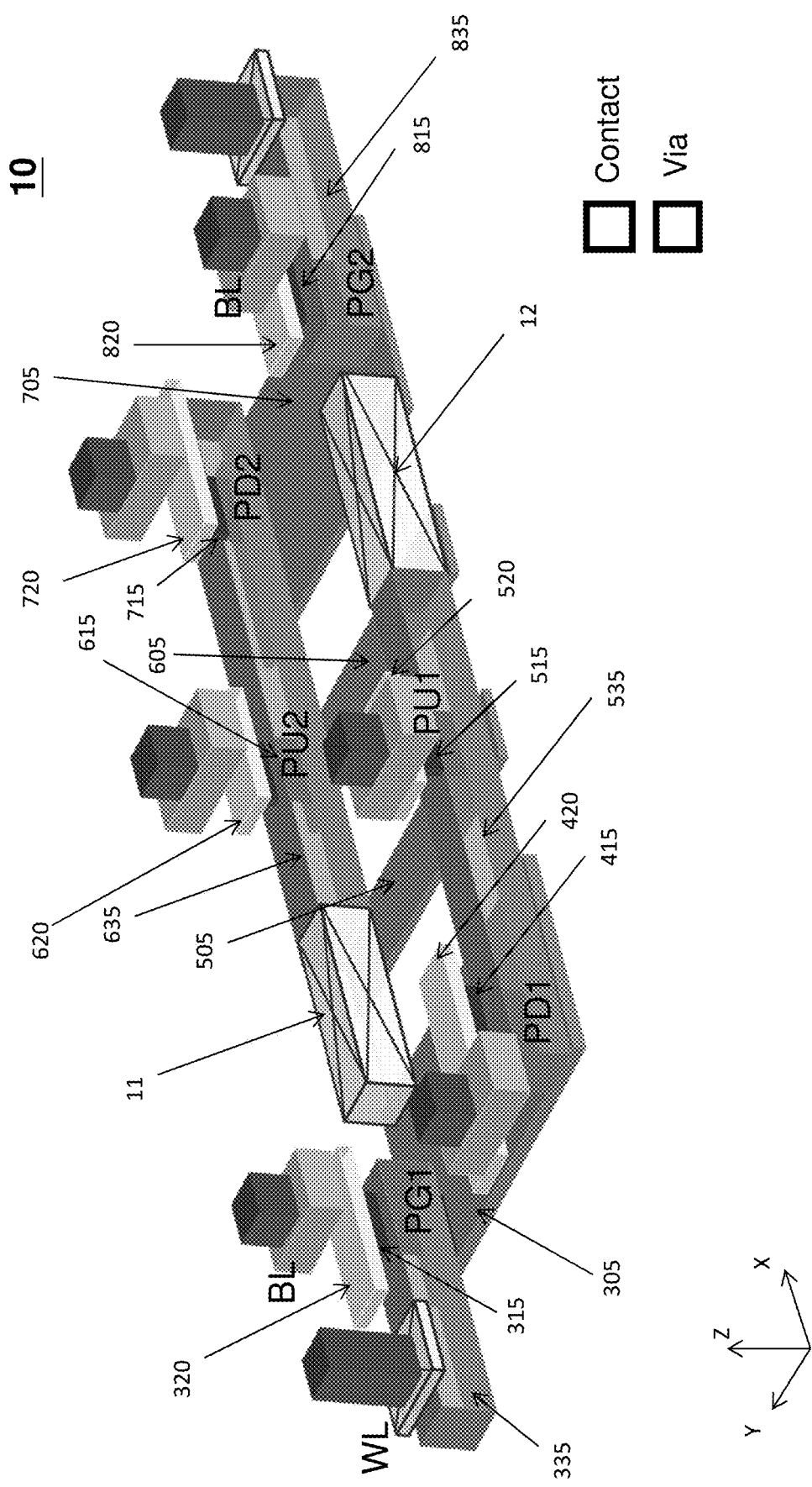
FIG. 4 is a perspective view schematically illustrating the SRAM cell illustrated in FIG. 3.
Figure 5:
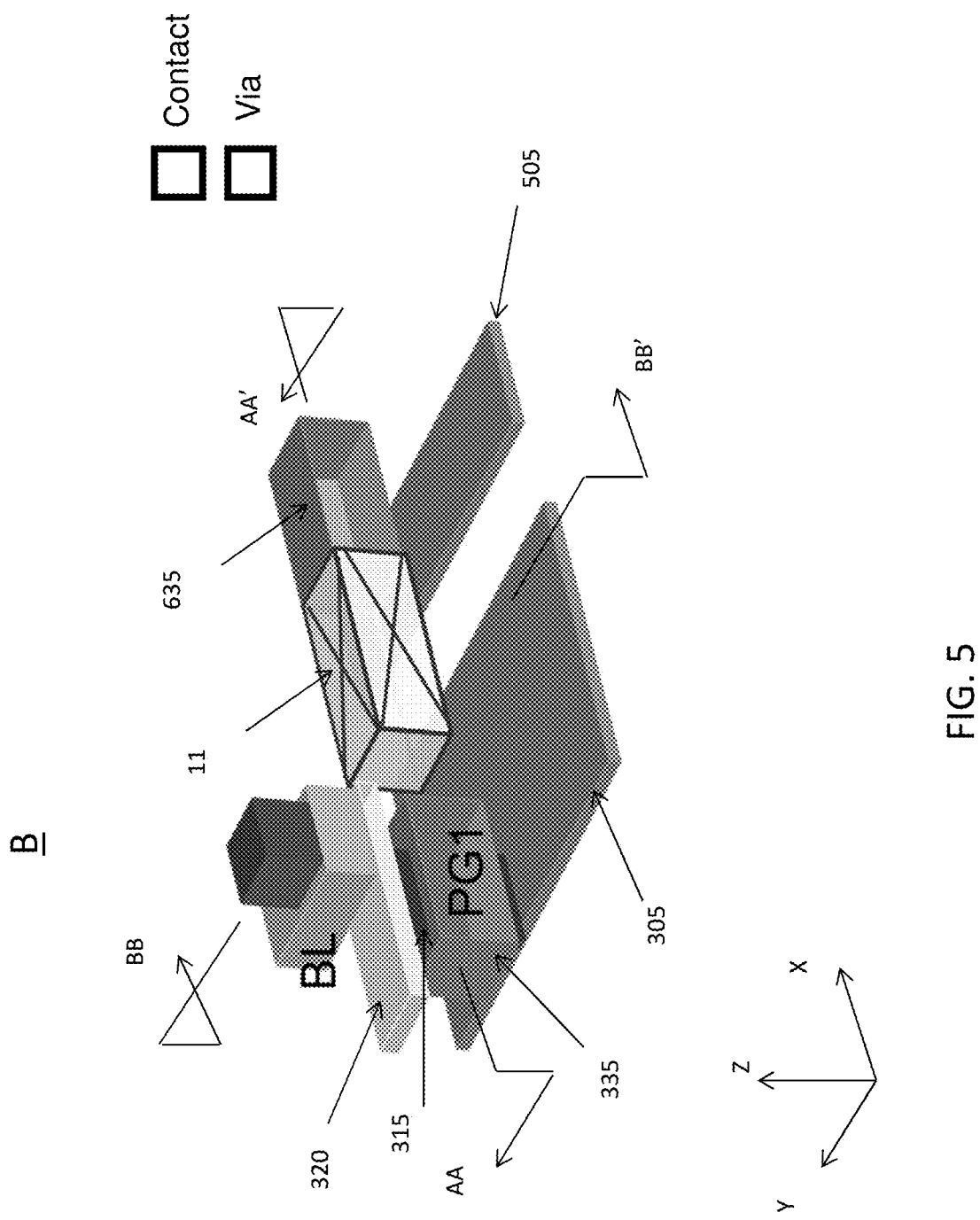
FIG. 5 is an enlarged perspective view schematically illustrating a portion B in FIG. 3.
Figure 6A:
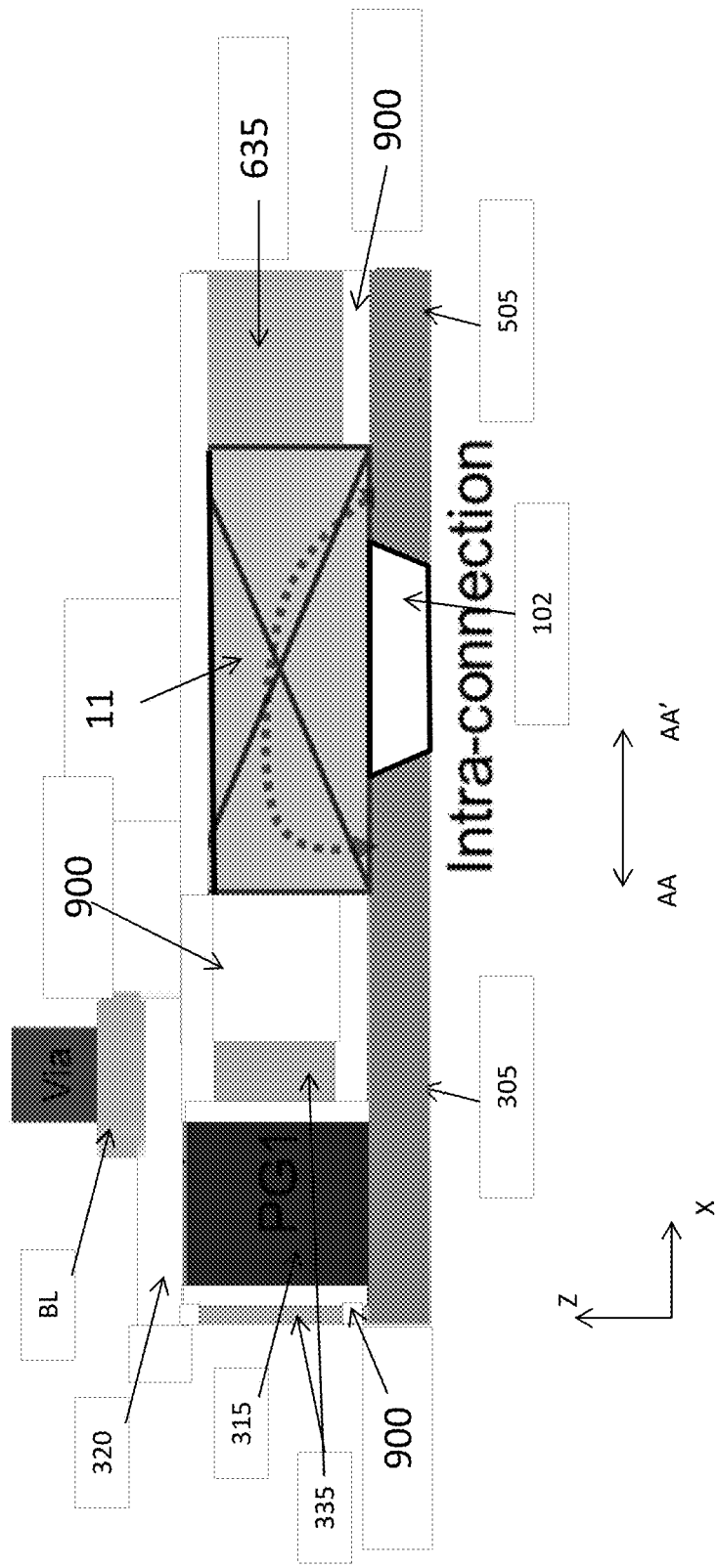
FIGS. 6A and 6B are cross-sectional views taken along lines AA-AA' and BB-BB' in FIG. 5, respectively, and additionally illustrate a dielectric layer not included in FIG. 5.
Figure 6B:
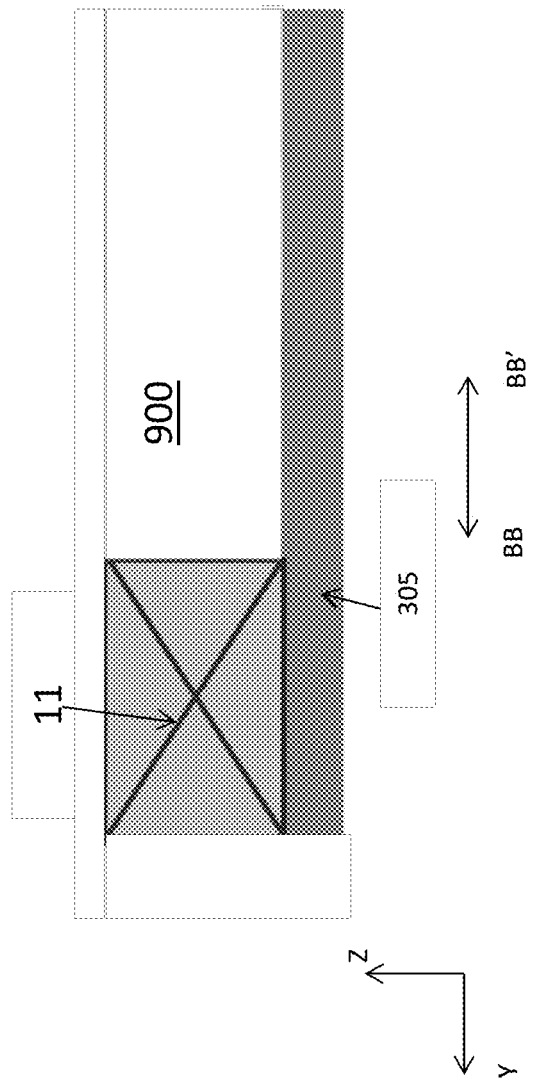
Figure 7A:
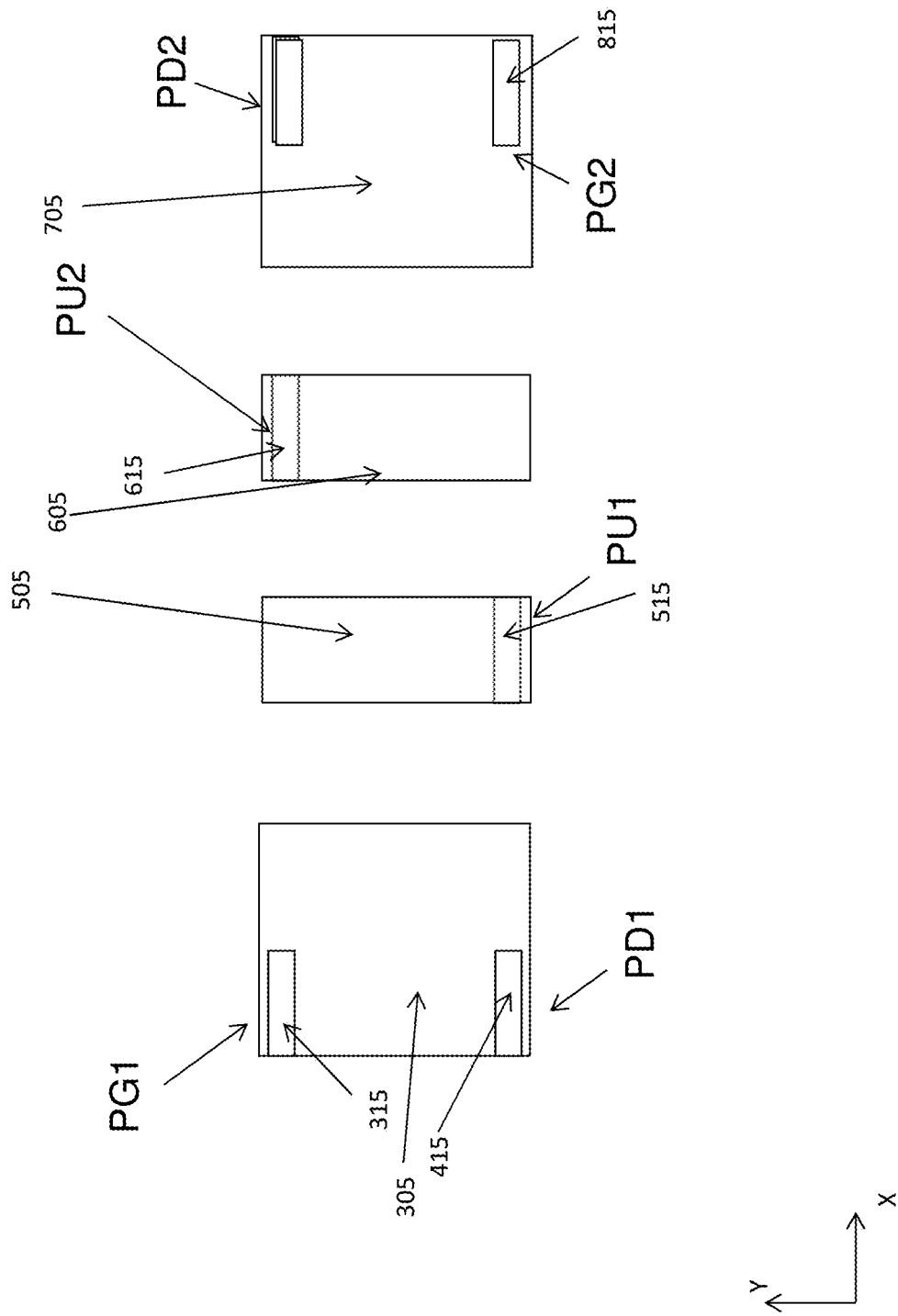
FIG. 7A is the layout of the SRAM cell illustrated in FIG. 3, in which only channel regions and source diffusion regions of FIG. 3 are illustrated.
Figure 7B:
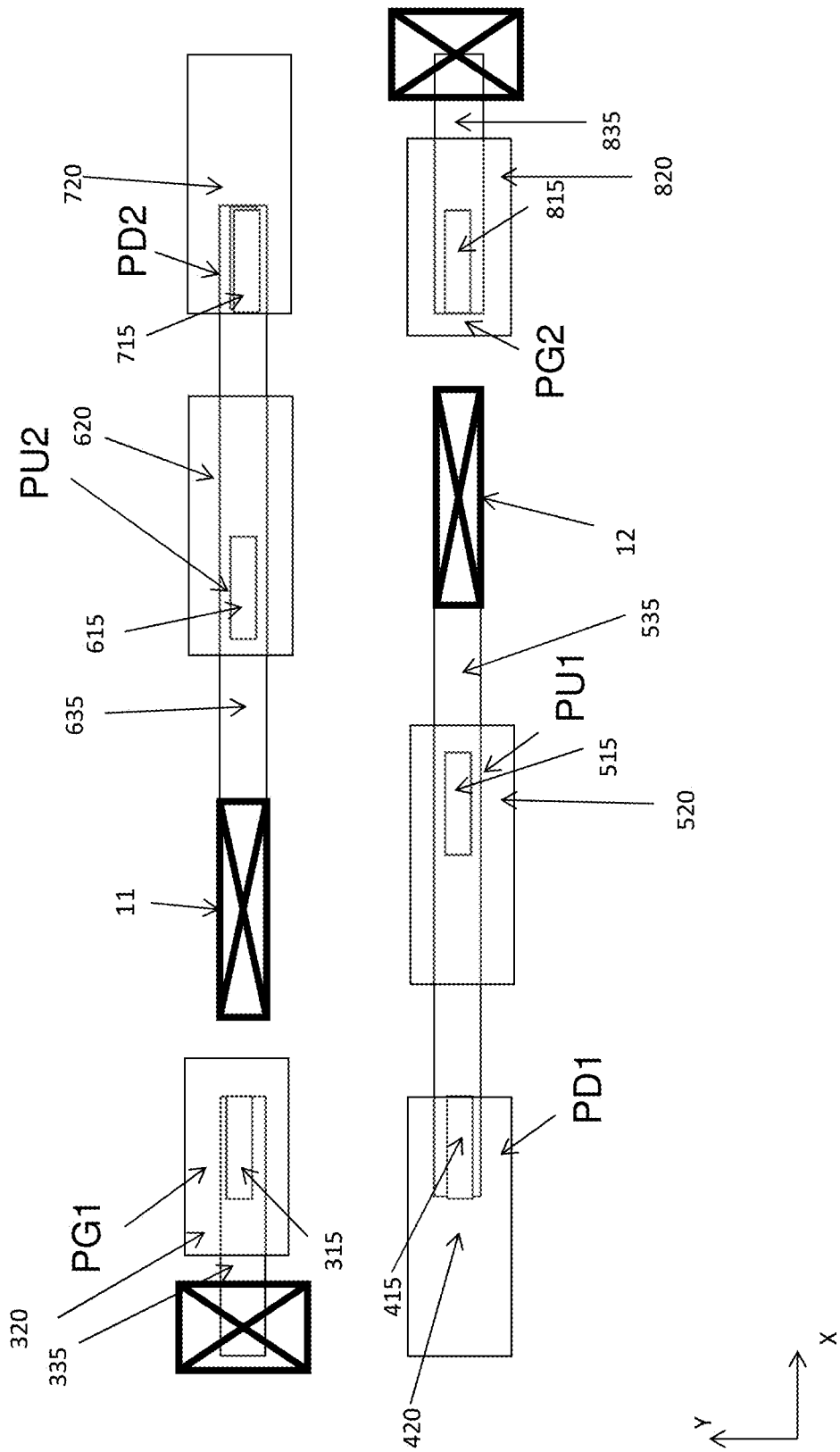
FIG. 7B is the layout of the SRAM cell illustrated in FIG. 3, in which only channel regions, gate layers, drain regions, and data storage electrodes of FIG. 3 are illustrated.

FIG. 3 is a layout of an SRAM cell according to some embodiments of the present disclosure, which may correspond to the SRAM cell 10 illustrated in FIG. 1A. FIG. 4 is a perspective view schematically illustrating the SRAM cell illustrated in FIG. 3. FIG. 5 is an enlarged perspective view schematically illustrating a portion B in FIG. 3. FIGS. 6A and 6B are cross-sectional views taken along lines AA-AA' and BB-BB' in FIG. 5, respectively, and additionally illustrate a dielectric layer not included in FIG. 5. FIG. 7A is the layout of the SRAM cell illustrated in FIG. 3, in which only channel regions and source diffusion regions are illustrated, and FIG. 7B is the layout of the SRAM cell illustrated in FIG. 3, in which only channel regions, gate layers, drain regions, and data storage electrodes are illustrated.

Referring to FIGS. 3 through 7B, an SRAM cell 10 includes first through fourth source diffusion regions 305, 505, 605, and 705 arranged along a first direction (X axis). When the aforementioned vertical transistors are employed to implement various transistors of the SRAM cell 10, channels and drain regions of the various transistors may be formed one after another on the first through fourth source diffusion regions 305, 505, 605, and 705. Although not shown, adjacent source diffusion regions may be separated by STI disposed therebetween.

Channels 315 and 415 and drain regions 320 and 420 of a first pass-gate transistor PG1 and a first pull-down transistor PD1 are formed over the same first source diffusion region 305, by which source regions of the first pass-gate transistor PG1 and the first pull-down transistor PD1 are formed. Thus, the source regions of the first pass-gate transistor PG1 and the first pull-down transistor PD1 are electrically connected to each other, as the first source diffusion region 305 is heavily doped with N type impurities and has a very low resistivity. A channel 515 of a first pull-up transistor PU1 is formed over the second source diffusion region 505, which is heavily doped with P-type impurities and by which a source region of the first pull-up transistor PU1 is formed. A channel 615 of a second pull-up transistor PU2 is formed over the third source diffusion region 605, which is heavily doped with P-type impurities and by which a source region of the first pull-up transistor PU1 is formed.

Channels 715 and 815 and drain regions 720 and 820 of a second pass-gate transistor PG2 and a second pull-down transistor PD2 are formed on the same fourth source diffusion region 705, by which source regions of the second pass-gate transistor PG2 and the second pull-down transistor PD2 are formed. Thus, the source regions of the second pass-gate transistor PG2 and the second pull-down transistor PD2 are electrically connected to each other, as the fourth source diffusion region 705 is heavily doped with N type impurities and has a very low resistivity.

Referring to FIG. 3, the channels 315, 615, and 715 of the first pass-gate transistor PG1, the second pull-up transistor PU2, and the second pull-down transistor PU2 may be arranged along a first path L1 parallel to the first direction (X axis), while the channels 415, 515, and 815 of the first pull-down transistor PD1, the first pull-up transistor PU1, and the second pass-gate transistor PG2 may be arranged along a second path L2 parallel to the first path L1. The first path L1 is spaced-apart from the second path L2 by a distance of D1 in a second direction (Y axis) perpendicular to the first direction.

As shown in FIGS. 3, 4, and 7B, a gate electrode 335 of the first pass-gate transistor PG1 surrounds the channel 315 of the first pass-gate transistor PG1 and extends, in a direction away from the first direction (X axis), from the channel 315 into a region outside the first source diffusion region 305. Gate electrodes of the second pull-up transistor PU2 and the second pull-down transistor PD2 are electrically connected to each other through a first gate line 635. The first gate line 635 surrounds the channels 615 and 715 of the second pull-up transistor PU2 and the second pull-down transistor PD2 and extends, in a direction away from the first direction (X axis), from a region of the channel 715 of the second pull-down transistor PD2 into a region above the second source diffusion region 505.

A gate electrode 835 of the second pass-gate transistor PG2 surrounds the channel 815 of the second pass-gate transistor PG2 and extends, in the first direction (X axis), from the channel 815 into a region outside the fourth source diffusion region 705. Gate electrodes of the first pull-up transistor PU1 and the first pull-down transistor PD1 are electrically connected to each other through the same gate line 535. The gate line 535 surrounds the channels 415 and 515 of the first pull-down transistor PD1 and the first pull-up transistor PU1 and extends, in the first direction (X axis), from a region of the channel 415 of the first pull-down transistor PD1 into a region above the third source diffusion region 605.

Although a dielectric layer, denoted by reference numeral 900, is illustrated in FIGS. 6A and 6B among FIGS. 3 through FIG. 7B, it should be appreciated, for example, with reference to FIG. 2, that one or more dielectric layers may be interposed between each channel and a respective gate electrode that surrounds the channel. It should also be appreciated, for example, still with reference to FIG. 2, that one or more dielectric layers may be interposed between source regions and gate electrodes so as to electrically isolate the source diffusion regions and the gate electrodes from each other. One of ordinary skill in the art will recognize that one or more dielectric layers are interposed between adjacent layers that are stacked on one another and that contact vias are formed to penetrate through the one or more dielectric layers to interconnect conductive layers that are separated by the one or more dielectric layers. Such descriptions will be omitted in order to avoid redundancy.

Referring to FIGS. 3 through 6B and FIG. 7B, the SRAM cell 10 further incudes a first data storage electrode 11 (which functions as the first data storage node ND11 of FIG. 1A), which may be formed of a material having electrical conductivity greater than that of the first gate line 635 and electrically connects the first gate line 635 to the first and second source diffusion regions 305 and 505. Accordingly, contact resistance at an interface of the first data storage electrode 11 and the first gate line 635 and contact resistance of an interface of the first data storage electrode 11 and any one of the first and second source diffusion regions 305 and 505 can be minimized. Thus, the first and second source diffusion regions 305 and 505 are electrically connected to each other through the first data storage electrode 11.

The first data storage electrode 11 may directly contact an end of the first gate line 635 and extend from the first gate line 635 along a direction from the channel 715 of the second pull-down transistor PD2 towards the channel 615 of the second pull-up transistor PU2. The gate electrodes of the second pull-up transistor PU2 and the second pull-down transistor PD2 are connected to each other through the first gate line 635 extending from the first data storage electrode 11 to the gate electrode of the second pull-down transistor PD2. One end portion of the first data storage electrode 11 may be directly formed on the first source diffusion region 305 and an opposite end portion of the first data storage electrode 11 may be directly formed on the second source diffusion region 505. According to some embodiments, the gate electrode 335 of the first pass-gate transistor PG1, the first data storage electrode 11, and the first gate line 635 are aligned to each other along the first direction (X axis). The first data storage electrode 11, through which the first gate line 635 and the first and second source diffusion regions 305 and 505 are electrically connected, linearly extends from the first gate line 635.

As described above, the source regions of the first pass-gate electrode PG1 and the first pull-down transistor PD1, the source region of the first pull-up transistor PU1, and the gate electrodes of the second pull-up transistor PU2 and the second pull-down transistor PD2 are electrically connected to each other through the first data storage electrode 11 disposed therebetween.

Referring still to FIGS. 3 through 6B and FIG. 7B, the SRAM cell 10 further incudes a second data storage electrode 12 (which functions as the second data storage node ND12 of FIG. 1A), which may be formed of a material having electrical conductivity greater than that of the second gate line 535 and electrically connects the second gate line 535 to the third and fourth source diffusion regions 605 and 705. Accordingly, contact resistance of an interface of the second data storage electrode 12 and the second gate line 535 and contact resistance of an interface of the second data storage electrode 12 and any one of the third and fourth source diffusion regions 605 and 705 can be minimized. Thus, the third and fourth source regions 605 and 705 are electrically connected to each other through the second data storage electrode 12.

The second data storage electrode 12 may directly contact an end of the second gate line 535 and extend from the second gate line 535 along a direction from the channel 415 of the first pull-down transistor PD1 towards the channel 515 of the first pull-up transistor PU1. That is, the gate electrodes of the first pull-up transistor PU1 and the first pull-down transistor PD1 are connected to each other through the second gate line 535 extending from the second data storage electrode 12 to the gate electrode of the first pull-down transistor PD1. One end portion of the second data storage electrode 12 may be directly formed on the fourth source diffusion region 705 and an opposite end portion of the second data storage electrode 12 may be directly formed on the third source diffusion region 605. According to some embodiments, the gate electrode 835 of the second pass-gate transistor PG2, the second data storage electrode 12, and the second gate line 535 are aligned to each other along the first direction (X axis). The second data storage electrode 11, through which the second gate line 535 and the third and fourth source diffusion regions 605 and 705 are electrically connected, linearly extends from the second gate line 535.

As described above, the source regions of the second pass-gate electrode PG2 and the second pull-down transistor PD2, the source region of the second pull-up transistor PU2, and the gate electrodes of the first pull-up transistor PU1 and the first pull-down transistor PD1 are electrically connected to each other through the second data storage electrode 12 disposed therebetween.

According to some embodiments, source regions, drain regions, and gate electrodes of some of the aforementioned transistors may be electrically connected to drains regions, sources regions, or gates electrodes of other of the aforementioned transistors, through interconnection lines such as the aforementioned first and second data storage electrodes 11 and 12. The first and second data storage electrodes 11 and 12 may be formed of the same material at the level of the gate lines with reference to a substrate on which the SRAM cell 10 is formed. Electrical conductivity of the first and second data storage electrodes 11 and 12 is greater than that of the first and second gate lines 635 and 535. Examples of the material for forming the first and second data storage electrodes 11 and 12 may include polysilicon, Ti-based silicide, Co-based silicide, Ni-based silicide, Pt-based silicide, W-based silicide, TiN, TaN, W, Cu, Al, or combinations thereof. The first and second data storage electrodes 11 and 12 may be manufactured by the same fabrication process which will be explained with reference to FIG. 8.

According to other embodiments, source regions, drain regions, and gate electrodes of some of the aforementioned transistors may be electrically connected to drains regions, sources regions, or gates electrodes of other of the aforementioned transistors, through contact vias and metal layers formed on the drain regions. For example, referring to FIGS. 3 through 6A, bitlines BL and BLB, a wordline WL, first and second power supply nodes Vdd and Vss, formed of one or more metal layers, are connected to drain regions and/or gate electrodes of some of the aforementioned transistors of the SRAM cell 10 through the contact vias.

Figure 8:
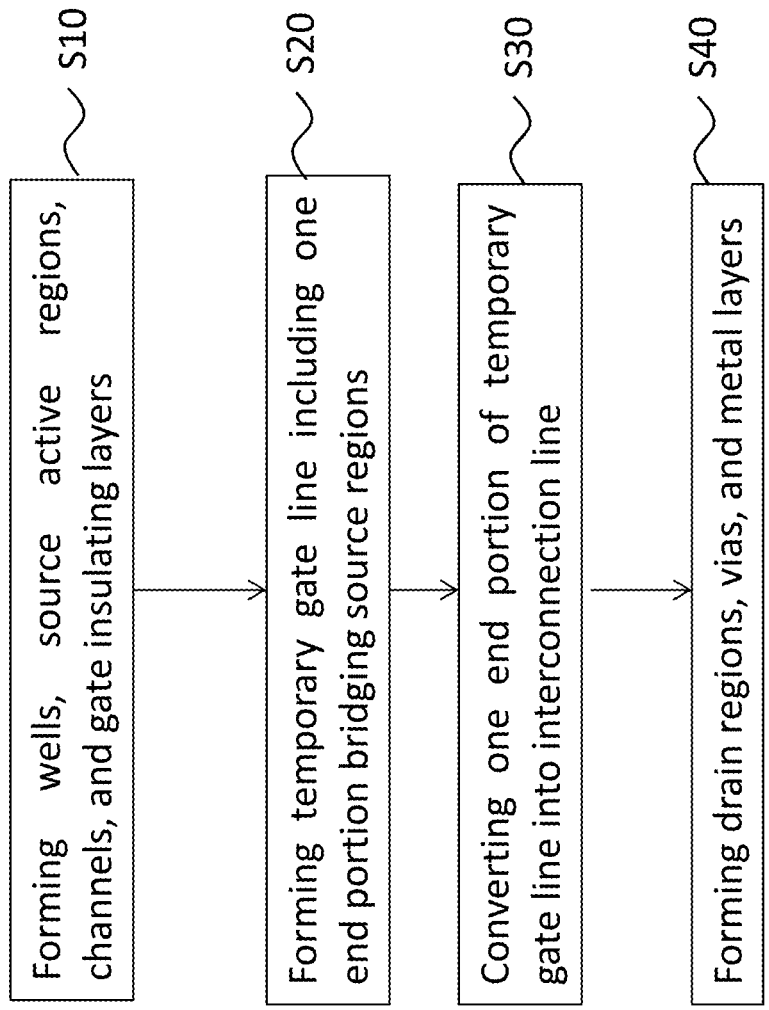
FIG. 8 is a flowchart illustrating a method for manufacturing an SRAM according to some embodiments of the present disclosure.

FIG. 8 is a flowchart illustrating a method for manufacturing an SRAM according to some embodiments of the present disclosure. For the convenience, the manufacturing method will be described with reference to FIGS. 2 through 8, using the SRAM cell 10 as an example.

First, after forming STI and N-type and P-type wells separated by STI, source diffusion regions including first through fourth source diffusion regions 305, 505, 605, and 705 are formed, and then channels and gate insulating layers are formed on the source diffusion regions (S10).

Next, a gate layer including a gate electrode 335 of a first pass-gate electrode PG1, a gate electrode 835 of a second pass-gate electrode PG2, a first temporary gate line which covers regions of a first gate line 635 and a first data storage electrode 11, and a second temporary gate line which covers regions of a second gate line 535 and a second data storage electrode 12 is formed (S20). Each of the first temporary gate line extends continuously from the first source diffusion region 305 to the fourth source diffusion region 705.

Next, the first data storage electrode 11 is formed by converting an end portion of the first temporary gate line corresponding to the region of the first data storage electrode 11 to one layer which may have electrically conductivity greater than that of the remaining portion of the first temporary gate line, and the second data storage electrode 12 is formed by converting an end portion of the second temporary gate line corresponding to the region of the second data storage electrode 12 to another layer which may have electrically conductivity greater than that of the remaining portion of the second temporary gate line (S30). Thus, the end portion of the first temporary gate line is converted to the first data storage electrode 11 and the remaining portion of the first temporary gate line becomes the first gate line 635. The formed first data storage electrode 11 electrically connects the remaining portion of the first temporary gate line, i.e., the first gate line 635, and the first and second source diffusion regions 305 and 505 to each other. The formed first data storage electrode 12 electrically connects the remaining portion of the second temporary gate line, i.e., the second gate line 535, and the third and fourth source diffusion regions 605 and 705 to each other. This step will be more apparent with reference to FIGS. 9A though 9E and FIGS. 10A through 10G which will be described later.

After the first and second data storage electrodes 11 and 12 are formed, the remaining portions of the SRAM cell 10, including drain regions of the aforementioned transistors, contact vias, and metal layers for first and second bitlines BL and BLB, a wordline WL, and first and second power nodes Vdd and Vss, may be formed (S40).

FIGS. 9A through 9E are cross-sectional views schematically illustrate a method for manufacturing a data storage electrode according to some embodiments of the present disclosure. For the convenience, the manufacturing method will be described with reference to FIGS. 2 through 9E, using the first data storage electrode 11 of the SRAM cell 10 as an example.

Figure 9A:
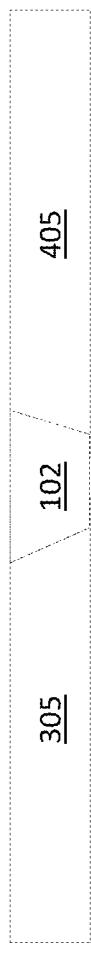
FIGS. 9A through 9E are cross-sectional views schematically illustrate a method for manufacturing a data storage electrode according to some embodiments of the present disclosure.

As shown in FIG. 9A, first and second source diffusion regions 305 and 505, separated by STI 102, are first formed.

Figure 9B:
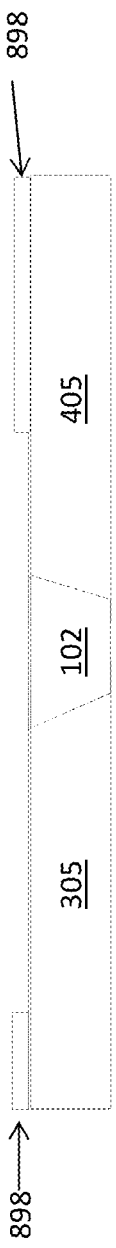

Then, referring to FIG. 9B, a dielectric layer 898 is formed on the first and second source diffusion regions 305 and 505. The formed dielectric layer 898 covers a region corresponding to a gate electrode 335 and a first gate line 635 to be described with reference to FIG. 9E.

Figure 9C:
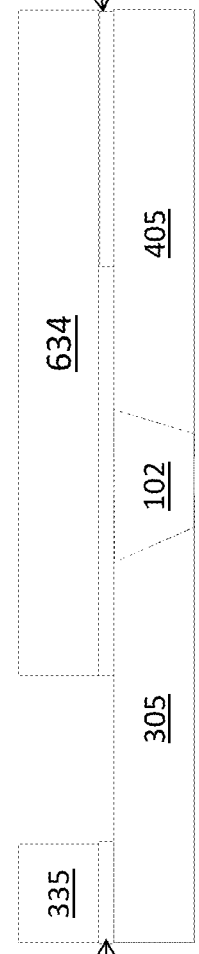

Next, as shown in FIG. 9C, a gate electrode 335 and a first temporary gate line 634 are formed by patterning a gate layer. The first temporary gate line 634 covers a region corresponding to a first data storage electrode 11 and the first gate line 635.

Figure 9D:
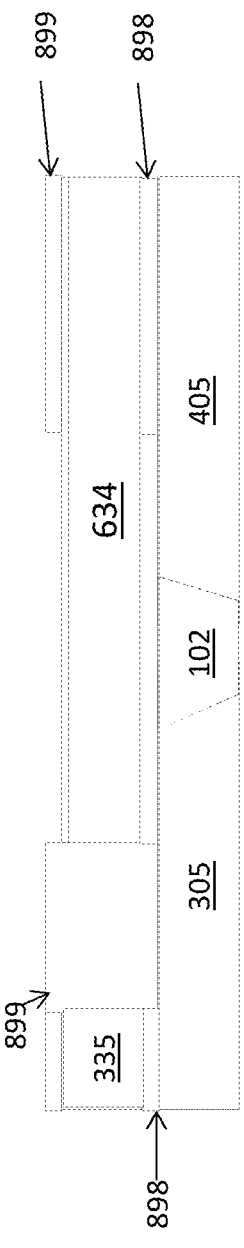

Next, as shown in FIG. 9D, another dielectric layer 899 is deposited and patterned. An exposed portion of the first temporary gate line 634 by the dielectric layer 899 corresponds to a region of the first data storage electrode 11.

Figure 9E:
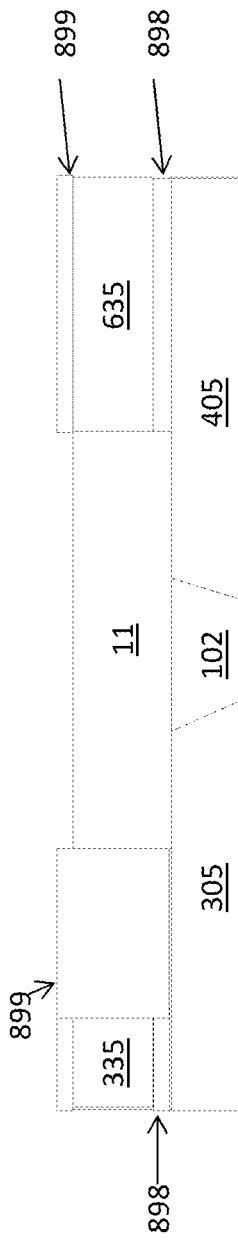

Next, as shown in FIG. 9E, impurities are doped into the exposed portion of the first temporary gate line 634 so as to convert the exposed portion of the first temporary gate line 634 to the first data storage electrode 11.

FIGS. 10A through 10F are cross-sectional views schematically illustrate a method for manufacturing a data storage electrode according to other embodiments of the present disclosure. For the convenience, the manufacturing method will be described with reference to FIGS. 2 through 8 and FIGS. 10A through 10F, using the first data storage electrode 11 of the SRAM cell 10 as an example.

As shown in FIG. 10A, first and second source diffusion regions 305 and 405, separated by STI 102, are first formed.

Then, referring to FIG. 10B, a dielectric layer 901 is formed on the first and second source diffusion regions 305 and 505 and the STI 102. Although not shown in FIG. 10B, the dielectric layer 901 may be patterned to cover a region corresponding to a gate electrode 335 and a first gate line 635 to be described later.

Next, as shown in FIG. 10C, a gate electrode 335 and a first temporary gate line 634 are formed by patterning a gate layer. The first temporary gate line 634 covers a region corresponding to a first data storage electrode 11 and the first gate line 635.

Next, as shown in FIG. 10D, another dielectric layer 902 is deposited and patterned. An exposed portion of the first temporary gate line 634 by the dielectric layer 902 corresponds to a region of the first data storage electrode 11.

Next, as shown in FIG. 10E, the exposed portion of the first temporary gate line 634 is removed to form an empty space. The dielectric layer 901 is also etched so as to expose portions of the first and second source diffusion regions 305 and 505 and the STI 102.

Next, as shown in FIG. 10F, a silicide layer 7 including Ti-based silicide, Co-based silicide, Ni-based silicide, Pt-based silicide, or combinations thereof is formed to at the empty space. If necessary, one or more layers 8 formed of a material such as polysilicon, Ti-based silicide, Co-based silicide, Ni-based silicide, Pt-based silicide, W-based silicide, TiN, TaN, W, Cu, Al, or combinations thereof, are further deposited to fill in the empty space so as to form the first data storage electrode 11.

Each of the above two alternatives to form the first data storage electrode 11 only requires a single photolithography step to make a mask layer having patterns corresponding to the first data storage electrodes 11 which is originally is a portion of the first temporary gate line 634. Thus, the first data storage electrode 11 is self-aligned to the remaining portion of the first temporary gate line 634 which becomes the first gate lines 635. Although not shown, the second data storage electrode 12 may be similarly formed, and accordingly, the second data storage electrode 12 is self-aligned to the second gate lines 535.

Referring back to FIGS. 3 and 4, it should be appreciated that a width, in the second direction (Y axis), of the SRAM cell 10 may be advantageously reduced, because the first and second data storage electrodes 11 and 12 are self-aligned to the first gate line 635 of the second pull-up transistor PU2 and the second pull-down transistor PD2 and to the second gate lines 535 of the first pull-up transistor PU1 and the first pull-down transistor PD1, respectively, and are not disposed at an intermediate portion between first and second paths L1 and L2 along which the first gate line 635 and the second gate line 535 extend, respectively.

Even though the SRAM cell 10 according to various embodiments of the present disclosure has a reduced width in the second direction (Y axis), a short-circuit between the first data storage electrode 11 and the second gate line 535 and between the second data storage electrode 12 and the second gate line 635 can be prevented, because the first and second data storage electrodes 11 and 12 are self-aligned to the first gate line 635 of the second pull-up transistor PU2 and the second pull-down transistor PD2 and to the second gate line 635 of the first pull-up transistor PU1 and the first pull-down transistor PD1, respectively, and are not disposed at the intermediate portion between the first and second paths L1 and L2.

Figure 11:
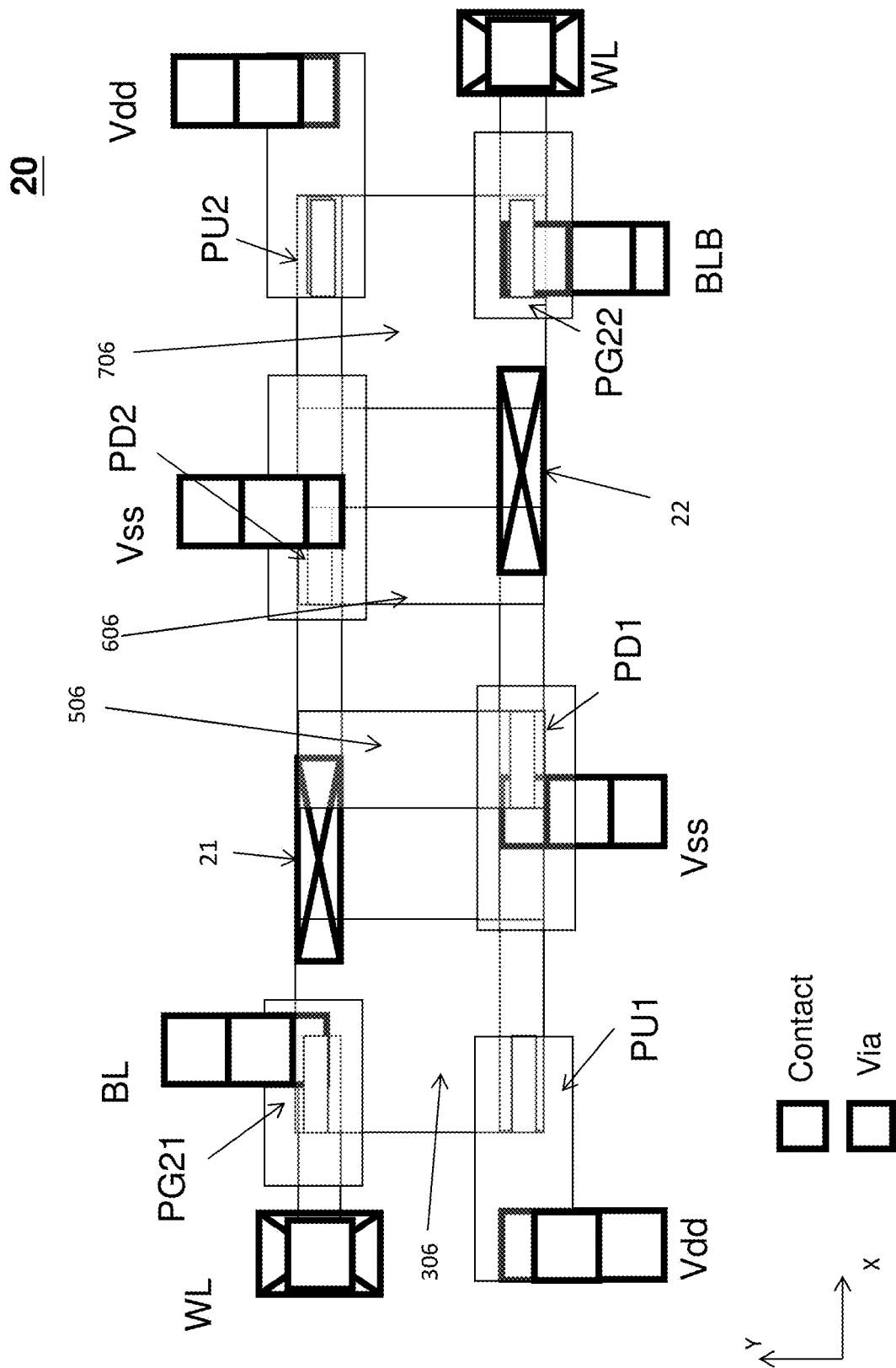
FIG. 11 is a layout of an SRAM cell according to other embodiments of the present disclosure.

FIG. 11 is a layout of an SRAM cell according to other embodiments of the present disclosure, which may correspond to the SRAM cell 20 illustrated in FIG. 1B.

Referring to FIGS. 3 and 11, in the layout of the SRAM cell 10 and the layout of the SRAM cell 20, the positions of the first pull-up transistor PU1 and the first pull-down transistor PD1 are switched, and the positions of the second pull-up transistors PU2 and the second pull-down transistors are also switched. In addition, although the layout of the contact layer of the SRAM cell 20 is substantially the same as the respective layer of the SRAM cell 10, supplied voltages to the first and second power supply nodes are swapped in the SRAM cell 20 with reference to the SRAM cell 10. It should be appreciated that dopants to form respective layers of the SRAM cell 10 may be replaced by different types of dopants. For example, a first source diffusion region 306, by which the first pull-up transistor PU1 and the first pass-gate transistor PG21 are formed, is heavily doped with P-type impurities. A second source diffusion region 506, by which the first pull-down transistor PD1 is formed, is heavily doped with N-type impurities. A third source diffusion region 606, by which the second pull-down transistor PD2 is formed, is heavily doped with N-type impurities. A fourth source diffusion region 706, by which the second pull-up transistor PU2 and the second pass-gate transistor PG22 are formed, is heavily doped with P-type impurities.

As shown in FIG. 13, a first data storage electrode 21 extends in a direction from the second pull-up transistor PU2 toward the second pull-down transistor PD2 and electrically connects the first and second source diffusion regions 306 and 506 and gate electrodes of the second pull-down transistor PD2 and the second pull-up transistor PU2 to each other. A second data storage electrode 22 extends in a direction from the first pull-up transistor PU1 toward the first pull-down transistor PD1 and electrically connects the third and fourth source diffusion regions 606 and 706 and gate electrodes of the first pull-down transistor PD1 and the first pull-up transistor PU1 to each other. Other descriptions of features overlapping those of the SRAM cell 10 described above will be omitted in order to avoid redundancy.

According to an aspect of the present disclosure, a static random access memory (SRAM) cell includes first through fourth transistors being first type transistors and fifth and sixth transistors being second type transistors. Source regions of the first and second transistors are formed by a first source diffusion region, source regions of the fifth and sixth transistors are formed by second and third source diffusion regions, respectively, and source regions of the third and fourth transistors are formed by a fourth source diffusion region. The SRAM cell further includes a first data storage electrode linearly extending from a first gate line connecting gate electrodes of the third transistor and the sixth transistor to each other and electrically connecting the first gate line and the first and second source diffusion regions to each other, and a second data storage electrode linearly extending from a second gate line connecting gate electrodes of the second transistor and the fifth transistor to each other and electrically connecting the second gate line and the third and fourth source diffusion regions to each other.

According to an aspect of the present disclosure, an integrated circuit includes a plurality of transistors formed in a plurality of source diffusion regions spaced-apart from each other and an interconnection line bridging two of the plurality of source diffusion regions and electrically connecting the two source diffusion regions to each other. The interconnection line linearly extends from a gate line which connects to a gate electrode of one of the plurality of transistors in a direction away from the one transistor.

According to an aspect of the present disclosure, a method for manufacturing a semiconductor device includes forming channels and gate insulating layers on a plurality of source diffusion regions, forming a temporary gate line including one end portion bridging two source diffusion regions of the plurality of source diffusion regions, forming an interconnection line electrically connecting the two source diffusion regions and the remaining portion of the temporary gate line to each other, by converting the one end portion of the temporary gate line to the interconnection line, and forming drain regions and metal layers so as to make connections to the gate electrodes, the source diffusion regions, and the drain regions.

According some aspects of the present disclosure, only a single photolithography step is required to pattern first and second data storage electrodes. No other interconnection lines are required to connect gate electrodes and the first and second data storage electrodes to each other.

According some aspects of the present disclosure, an area of an SRAM cell may be reduced, because even with a slight increase in a length of the SRAM cell, a width of the SRAM cell may be significantly reduced, due to the first and second data storage electrodes being self-aligned to gate electrodes and not disposed at an intermediate portion between the gate electrodes.

According some aspects of the present disclosure, a short-circuit between the first data storage electrode and the second gate line and between the second data storage electrode and the second gate line may be prevented, because the first and second data storage electrodes are self-aligned to the first and second gate lines, respectively, and are not disposed at the intermediate center portion between the first and second gate lines.

It should be appreciated that interconnection lines, such as the first and second data storage electrodes, are not limited to a 6-T SRAM cell. According to some embodiments of the present disclosure, the interconnection lines between gate electrodes and source diffusion regions may be employed in an 8-T SRAM cell. The interconnection lines may not be limited to SRAM. According to other embodiments, the interconnection lines between gate electrodes and source diffusion regions may be employed in other integrated circuits.

Although in the aforementioned embodiments, an interconnection line, such as the first and second data storage electrodes, is formed at an end of one of the first and second gate lines, the present disclosure is not limited thereto. According to other embodiments, an interconnection line may be formed between two gate lines that are aligned to each other and directly connect the two gate lines to each other.

Although in the aforementioned embodiments, an interconnection line, such as the first and second data storage electrodes, bridges two source diffusion regions to directly connect the two source diffusion regions to each other, the present disclosure is not limited thereto. According to other embodiments, an interconnection line may be disposed over three or more source diffusion regions and directly electrically connect the three or more source diffusion regions to each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a static random access memory (SRAM) device, comprising:
   forming first through fourth source diffusion regions;
   forming channel regions of first and second transistors on the first source diffusion region, wherein source regions of the first and second transistors are made of the first source diffusion region;
   forming channel regions of third and fourth transistors on the fourth diffusion region, wherein source regions of the third and fourth transistors are made of the fourth source diffusion region;
   forming channel regions of fifth and sixth transistors on the second and third source diffusion regions, respectively, wherein source regions of the fifth and sixth transistors are made of the second and third source diffusion regions, respectively;
   forming a first gate line surrounding the channel regions of the third transistor and the sixth transistor and a gate electrode surrounding the channel region of the first transistor;
   forming a second gate line surrounding the channel regions of the fourth transistor and the fifth transistor and a gate electrode surrounding the channel region of the second transistor;
   forming a first data storage electrode linearly extending, in a direction from the third transistor to the sixth transistor, from the first gate line, disposed over the first and second diffusion regions, and electrically connecting the first gate line and the first and second source diffusion regions to each other;
   forming a second data storage electrode linearly extending, in a direction from the second transistor to the fifth transistor, from a second gate line, disposed over the third and fourth diffusion regions, and electrically connecting the second gate line and the third and fourth source diffusion regions to each other; and
   forming drain regions of the first through sixth transistors.

2. The method of claim 1, wherein:
   forming the first data storage electrode and the first gate line comprises:
      forming a first temporary gate line covering regions corresponding to the first data storage electrode and the first gate line; and
      doping a portion of the first temporary gate line covering a region corresponding to the first data storage electrode, such that the doped portion of the first temporary gate line is converted to the first data storage electrode and a remaining undoped portion of the first temporary gate line is converted to the first gate line, and
   forming the second data storage electrode and the second gate line comprises:
      forming a second temporary gate line covering regions corresponding to the second data storage electrode and the second gate line; and
      doping a portion of the second temporary gate line covering a region corresponding to the second data storage electrode, such that the doped portion of the second temporary gate line is converted to the second data storage electrode and a remaining undoped portion of the second temporary gate line is converted to the second gate line.

3. The method of claim 1, wherein:
forming the first data storage electrode and the first gate line comprises:
  forming a first temporary gate line covering regions corresponding to the first data storage electrode and the first gate line;
  removing a portion of the first temporary gate line covering a region corresponding to the first data storage electrode, such that a remaining portion of the first temporary gate line is converted to the first gate line; and
  forming the first data storage electrode in a space where the portion of the first temporary gate line is removed, and
forming the second data storage electrode and the second gate line comprises:
  forming a second temporary gate line covering regions corresponding to the second data storage electrode and the second gate line;
  removing a portion of the second temporary gate line covering a region corresponding to the second data storage electrode, such that a remaining portion of the second temporary gate line is converted to the second gate line; and
  forming the second data storage electrode in a space where the portion of the second temporary gate line is removed.

4. The method of claim 3, wherein:
forming the first data storage electrode comprises filling a first silicide layer in the space where the portion of the first temporary gate line is removed, and
forming the second data storage electrode comprises filling a second silicide layer in the space where the portion of the second temporary gate line is removed.

5. The method of claim 4, wherein the first and second silicide layers include one selected from the group consisting of Ti-based silicide, Co-based silicide, Ni-based silicide, Pt-based silicide, or combinations thereof.

6. The method of claim 4, wherein:
forming the first data storage electrode further comprises filling a conductive material over the first silicide layer in the space where the portion of the first temporary gate line is removed, and
forming the second data storage electrode further comprises filling a conductive material over the second silicide layer in the space where the portion of the second temporary gate line is removed.

7. The method of claim 6, wherein the conductive material includes one selected from the group consisting of polysilicon, Ti-based silicide, Co-based silicide, Ni-based silicide, Pt-based silicide, W-based silicide, TiN, TaN, W, Cu, Al, or combinations thereof.

8. The method of claim 1, wherein the first through fourth source diffusion regions are sequentially arranged spaced-apart from one another.

9. The method of claim 1, wherein:
the first data storage electrode comprises a first end which is in contact with an end of the first gate line and which is disposed on and in contact with the second source diffusion region, and a second end which is disposed on and in contact with the first source diffusion region and which is spaced-apart from a gate electrode of the first transistor, and
the second data storage electrode comprises a first end which is in contact with an end of the second gate line and which is disposed on and in contact with the third source diffusion region, and a second end which is disposed on and in contact with the fourth source diffusion region and which is spaced-apart from a gate electrode of the fourth transistor.

10. The method of claim 9, wherein:
the gate electrode of the first transistor, the first data storage electrode, and the first gate line are aligned to each other, and
the gate electrode of the fourth transistor, the second data storage electrode, and the second gate line are aligned to each other.

11. The method of claim 1, wherein:
the first and second source diffusion regions and the first gate line are electrically connected to each other only through the first data storage electrode, and
the third and fourth source diffusion regions and the second gate line are electrically connected to each other only through the second data storage electrode.

12. The method of claim 1, wherein the source region, the channel, and the drain region of a respective one of the first through sixth transistors are vertically stacked over a substrate.

13. The method of claim 1, wherein each of the first and second data storage electrodes is in contact with a shallow trench isolation (STI).

14. A method for manufacturing a semiconductor device, the method comprising:
forming channels and gate insulating layers on a plurality of source diffusion regions;
forming a temporary gate line, made of a first conductive material, including a first portion covering two source diffusion regions of the plurality of source diffusion regions and a second portion surrounding one or more of the channels;
forming an interconnection line electrically connecting the two source diffusion regions by replacing the first material constituting the first portion of the temporary gate line with a second conductive material, such that the second portion of the temporary gate line is converted to a gate electrode layer surrounding the one or more of the channels; and
forming drain regions and metal layers so as to make connections to the gate electrodes, the source diffusion regions, and the drain regions.

15. The method of claim 14, wherein the source region, the channel, and the drain region of a respective one of transistors are vertically stacked over a substrate.

16. The method of claim 14, wherein:
the interconnection line is formed of one selected from the group consisting of polysilicon, Ti-based silicide, Co-based silicide, Ni-based silicide, Pt-based silicide, W-based silicide, TiN, TaN, W, Cu, Al, and combinations thereof.

17. A method for manufacturing a semiconductor device, the method comprising:
forming channels and gate insulating layers on a plurality of source diffusion regions;
forming a temporary gate line including one end portion bridging two source diffusion regions of the plurality of source diffusion regions;
forming an interconnection line electrically connecting the two source diffusion regions and the remaining portion of the temporary gate line to each other, by converting the one end portion of the temporary gate line to the interconnection line; and forming drain regions and metal layers so as to make connections to the gate electrodes, the source diffusion regions, and the drain regions.

18. The method of claim 17, wherein the forming the interconnection line comprises:
  forming a mask layer exposing the one end portion of the temporary gate line; and
  doping the exposed one end portion of the temporary gate line so as to form the interconnection line.

19. The method of claim 17, wherein the forming the interconnection line comprises:
  removing the end portion of the temporary gate line to form an empty space; and
  filling the empty space with a conductive material, so as to form the interconnection line.

20. The method of claim 17, wherein the interconnection line is formed of one selected from the group consisting of polysilicon, Ti-based silicide, Co-based silicide, Ni-based silicide, Pt-based silicide, W-based silicide, TiN, TaN, W, Cu, Al, and combinations thereof.

* * * * *